United States Patent
Bandou

(10) Patent No.: US 6,288,439 B1
(45) Date of Patent: Sep. 11, 2001

(54) TAPE CARRIER PACKAGE FOR A SEMICONDUCTOR DEVICE

(75) Inventor: Tooru Bandou, Urawa (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/524,817

(22) Filed: Mar. 14, 2000

(30) Foreign Application Priority Data

Mar. 15, 1999 (JP) .................................................. 11-067964

(51) Int. Cl.⁷ .................................................. H01L 23/495
(52) U.S. Cl. .......................... 257/666; 257/676; 257/692
(58) Field of Search .................................. 257/666, 676, 257/668, 674, 773, 692

(56) References Cited

U.S. PATENT DOCUMENTS 5,442,231 * 8/1995 Miyamoto et al. .................. 257/666
5,598,030 * 1/1997 Imai et al. ............................ 257/666

\* cited by examiner

Primary Examiner—Roy Potter
(74) Attorney, Agent, or Firm—Bret J. Peterson; Frederick J. Telecky, Jr.

(57) ABSTRACT

The objective of this invention is to prevent the defects of a semiconductor chip occurring when the passivation film or oxide film is damaged by reducing the stress applied to the main plane of the semiconductor chip during the curing stage of a potting resin in an overlap type TCP semiconductor device. In overlap type TCP semiconductor device 10, an elastic film 7 is formed on insulating film 2 on the side that faces the main plane of semiconductor chip 1. The filler made of silica oxide and contained in the supplied potting resin 6 flows into the space S between semiconductor chip 1 and insulating film 2 formed by support bumps 5. As potting resin 6 cures, the volume of the resin is reduced, and the space S is also reduced. The filler with a relatively large size is sandwiched between the main plane of semiconductor chip 1 and insulating film 2 to apply stress to the chip's main plane. However, since said elastic film 7 is formed on the surface of insulating film 2 which has contact with the filler, the stress applied to semiconductor chip 1 can be reduced.

4 Claims, 3 Drawing Sheets

TAPE CARRIER PACKAGE FOR A SEMICONDUCTOR DEVICE

FIELD OF THE INVENTION

The present invention pertains to a type of TCP (Tape Carrier Package) semiconductor device. In particular, the present invention pertains to a TCP semiconductor device which has an insulating film that overlaps the main plane of a semiconductor chip.

BACKGROUND OF THE INVENTION

The TCP semiconductor device has been widely used as driving LSI for liquid-crystal display devices because it is thinner than a QFP (Quad Flat Package) and it is easy to install more pins on this kind of semiconductor device. There has been a demand in recent years to use larger liquid-crystal panels in the same size frame. Consequently, the development of a TCP semiconductor device with a smaller planar size is required.

The overlap-type TCP semiconductor device has been developed to meet the aforementioned demand. This semiconductor device has part of an insulating film overlapping the main plane of a semiconductor chip. When a part of the semiconductor chip is overlapped, the external dimensions can be reduced without reducing the planar area of the film for forming the conductor pattern. In other words, as shown in FIG. 4, an insulating film 2 having an opening 2a smaller than semiconductor chip 1 is used in an overlap-type TCP semiconductor device. Multiple support bumps 5 are formed along the circumference of opening 2a together with conductor bumps 4 used for connecting inner leads 3a of leads 3 on the surface where the circuit elements are formed, that is, on the main plane of semiconductor chip 1. With the aid of said support bumps 5, insulating film 2 is supported on the main plane of semiconductor chip 1 with a prescribed gap between them. Potting resin 6 is supplied to opening 2 of the aforementioned insulating film. As a result, the main plane of semiconductor chip 1 is covered. In this case, the supplied potting resin flows into the space S between semiconductor chip 1 and insulating film 2 formed by support bumps 5. In this way, the bonding between semiconductor chip 1 and insulating film 2 can be reinforced.

A type of potting resin prepared by adding about 20 wt % (with respect to the total weight) of an organic solvent and about 70 wt % of a filler made of silicon oxide into an epoxy resin has been used widely to coat the aforementioned semiconductor chip. Because the potting resin contains an organic solvent, it is possible to dissolve the epoxy resin and adjust the viscosity. Also, because the potting resin contains the silicon oxide filler, the linear expansion coefficient of the resin can be significantly reduced.

However, while the aforementioned potting resin is being cured, the filler contained in the resin which exists between said semiconductor chip 1 and insulating film 2 might damage the passivation film and oxide film formed on the main plane of semiconductor chip 1. The damage will cause a short circuit between the different metal layers in the chip. In other words, as shown in FIG. 5, the solvent contained in the resin is gasified during the curing stage. The volume is reduced by about 30% compared with that during the potting stage. The space S between semiconductor chip 1 and insulating film 2 becomes narrower with the shrinkage. As a result, the filler with a relatively large size and contained in the resin existing in said space S is sandwiched between the semiconductor chip and the insulating film and thus applies a stress to the main plane of the semiconductor chip. The passivation film and oxidation film will be damaged by the aforementioned stress. As a result, a short circuit will occur between the metal layers in the chip.

Consequently, one purpose of the present invention is to prevent the chip's defects caused by the damage of the passivation film and oxidation film by reducing the stress applied to the main plane of the semiconductor chip during the curing stage of the potting resin.

Another purpose of the present invention is to reduce the stress applied to the main plane of the semiconductor chip without changing the basic structure of the overlap-type TCP semiconductor device.

SUMMARY OF THE INVENTION

In order to realize the aforementioned purposes, the present invention provides a type of semiconductor device characterized by forming an elastic film on the insulating film on the side of the main plane of the semiconductor chip in a so-called overlap-type TCP semiconductor device. The elastic film can be made of solder resist.

The filler made of silicon oxide contained in the supplied potting resin also flows into the space between the semiconductor chip and the insulating film formed by the support bumps. As the potting resin cures, its volume shrinks, also reducing the aforementioned space. As a result, the filler of relatively large size is sandwiched between the main plane of the semiconductor chip and the insulating film and applies stress to the main plane of the chip. However, since the aforementioned elastic film is formed on the surface of the insulating film which has contact with the filler, the stress applied to the aforementioned semiconductor chip can be reduced.

In this case, the aforementioned elastic film is preferred to have an elastic modulus of 165 kgf/mm$^2$ or less and a thickness of 20 $\mu$m or more.

REFERENCE NUMERALS AND SYMBOLS AS SHOWN IN THE DRAWINGS

In the figures, 1 represents a semiconductor chip, 2 represents an insulating film, 2a represents an opening, 3 represents a lead, 3a represents an inner lead, 4 represents a conductor bump, 5 represents a support bump, 6 represents a potting resin, 7 represents an elastic film, and 10 represents a semiconductor device.

DESCRIPTION OF EMBODIMENTS

Figure 1:
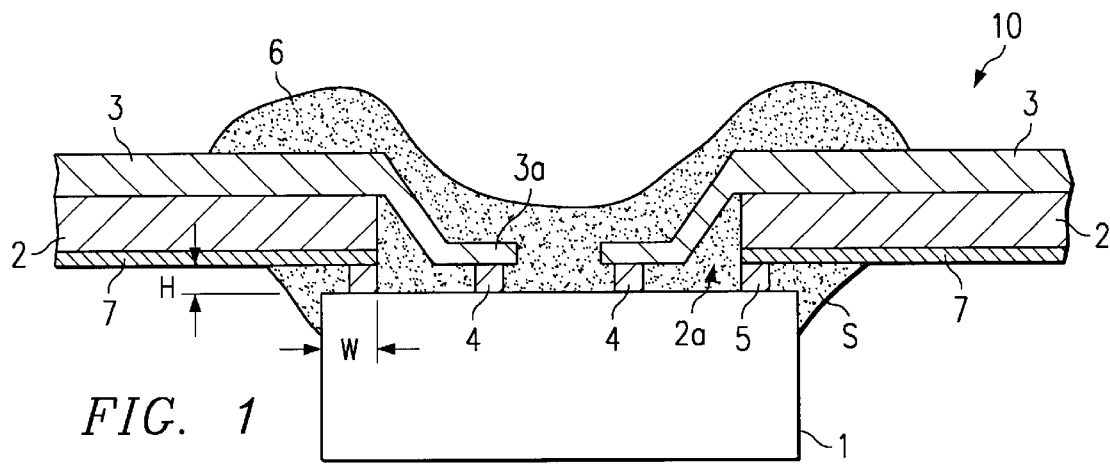
FIG. 1 is a cross-sectional view illustrating an overlap type TCP semiconductor device to which the present invention can be applied.

In the following, an embodiment of the present invention will be explained with reference to the figures. FIG. 1 is a cross-sectional view illustrating an embodiment of the overlap-type TCP semiconductor device disclosed in the present invention. As shown in the figure, the overlap-type TCP semiconductor device 10 has an insulating film 2 which uses a TAB (Tape Automated Bonding) tape as the substrate. In the present invention, insulating film 2 can be made of a polyimide-type resin like in a conventional normal TCP semiconductor device. The insulating film 2 is slightly larger than the planar size of semiconductor chip 1. The semiconductor chip used for LSI driving of a liquid-crystal display is usually rectangular. Consequently, said insulating film 2 is also usually rectangular. However, the insulating film used in the present invention is not limited to a rectangular shape.

Said insulating film 2 has an opening 2a which is a little smaller than the main plane of semiconductor chip 1 in the center. During assembly of the semiconductor device, the center of the main plane of semiconductor chip 1 is aligned with the center of said opening 2a of the insulating film. As a result, the array of conductor bumps 4 made of gold or other metal formed on the electrode pads of semiconductor chip 1 is exposed in opening 2a. On the other hand, since said opening 2a is a little smaller than the main plane of semiconductor chip 1, the circumference of opening 2a and the circumference of the main plane of semiconductor chip 1 are arranged at the positions that overlap in the vertical direction. In an embodiment, the overlap width, that is, the dimension W shown in the figure, is about 0.2 mm.

A conductor pattern comprised of leads 3 made of copper or other metal is formed on insulating film 2. The conductor pattern can be formed on insulating film 2 using a conventional method. For example, the conductor pattern can be formed using either of the following method. In the first method, a copper foil is adhered to insulating film 2 using an adhesive. Then, the unnecessary part is removed using the photolithographic technology. In the second method, a thin metal can be formed directly on insulating film 2 by means of sputtering. Then, the required pattern is formed using the photolithographic technology, followed by growing a copper foil using the electrolytic plating method. One end on the inner side of each lead 3 formed by either of the aforementioned methods, that is, inner lead 3a which extends into opening 2a of insulating film 2, is connected to a conductor bump 4 on semiconductor chip 1.

Elastic film 7 is formed on the bottom of insulating film 2, that is, on the side of the assembly surface of semiconductor chip 1. In the example shown in FIG. 1, elastic film 7 is formed over the entire bottom of insulating film 2. In consideration of the effect of the present invention, it is important to position elastic film 7 over the main plane of semiconductor chip 1. In this way, as will be explained later, the upper part of the filler of relatively large size and contained in potting resin 6 is brought to contact with elastic film 7 instead of having direct contact with insulating film 2. It is preferred that said elastic film 7 have an elastic modulus of 165 kgf/mm$^2$ or less and a thickness of 20 $\mu$m or more. Elastic film 7 can be made of an epoxy-type, polyimide-type, or urethane-type elastic resin material. Several methods can be used to form elastic film 7 on insulating film 2. For example, a material used for elastic film 7 can be coated on insulating film 2 using a squeegee, followed by drying. The melted material used for elastic film 7 can also be potted uniformly on insulating film 2. It is also possible to adhere elastic film 7, which is formed separately, onto insulating film 2 directly or using an adhesive.

Multiple support bumps 5 are formed at prescribed intervals in the peripheral portion of the main plane of semiconductor chip 1, that is, in the region overlapped with insulating film 2. With the aid of support bumps 5, a space S corresponding to the height of the bumps is formed between the main plane of the semiconductor chip and the bottom of elastic film 7 formed on insulating film 2. In this way, flow of potting resin 6 into space S can be accelerated. Resin 6 is supplied into opening 2 of the aforementioned insulating film by means of potting. In this way, the main plane of semiconductor chip 1 is coated. The resin supplied by means of potting flows into the space between semiconductor chip 1 and elastic film 7 formed by support bumps 5. The height of support bumps 5, that is, the height of space S can be set at will to control the amount of potting resin 6 that flows into the space. In one embodiment, the height is about 15 $\mu$m.

The potting resin used in the present invention is prepared by adding an organic solvent and a filler made of silica oxide (referred to as silica filler hereinafter) to the epoxy type resin. The total amount of the organic solvent, such as alcohols and ketones, contained in the resin is about 20 wt %. Basically, the organic solvent is used to dissolve the resin and control the viscosity. The content of the organic solvent can be adjusted as required. The amount of the silica filler contained in the resin is about 70 wt %. As described above, since the silica filler is the cause of the damage to the main plane of semiconductor chip 1, its content should be as low as possible. On the other hand, a prescribed amount of silica filler is required to restrain the linear expansion coefficient of the resin and to improve the mechanical strength of the resin. In the present invention, it is possible to add phenol/novolak or another curing agent, amine or another curing promoter, carbon black, pigment, or other coloring agent into potting resin 6.

In the following, the manufacturing method of said TCP semiconductor device 10 will be briefly explained with reference to FIG. 2. First, conductor bumps 4 and support bumps 5 are formed on the electrode pads of semiconductor chip 1 (FIG. 2(A)). It is also possible to form conductor bumps 4 on the lead side. In another operation, conductor pattern 3 is formed on the surface of insulating film 2, and elastic film 7 is formed on the back side of the insulating film to complete the TAB tape (FIG. 2(B)). Elastic film 7 can be formed either before or after conductor pattern 3 and opening 2a are formed in insulating film 2. However, it is preferred to coat or adhere elastic film 7 over the entire region of insulating film 2 before opening 2a is formed and then form the opening by punching or etching both insulating film 2 and elastic film 7.

Figure 2A:
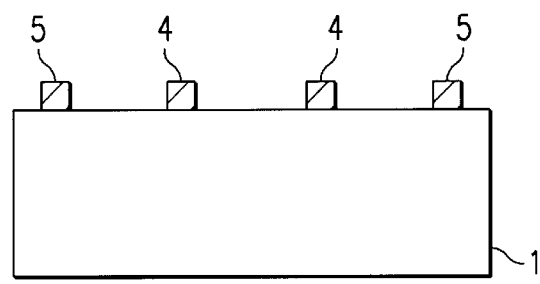
FIGS. 2A through 2E illustrate the manufacturing process of the semiconductor device shown in FIG. 1.
Figure 2B:
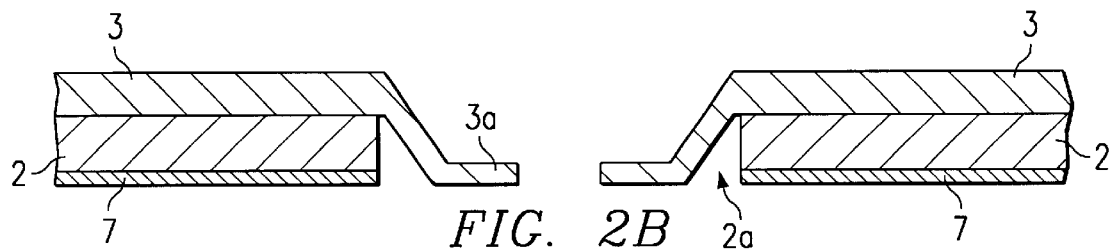
Figure 2C:
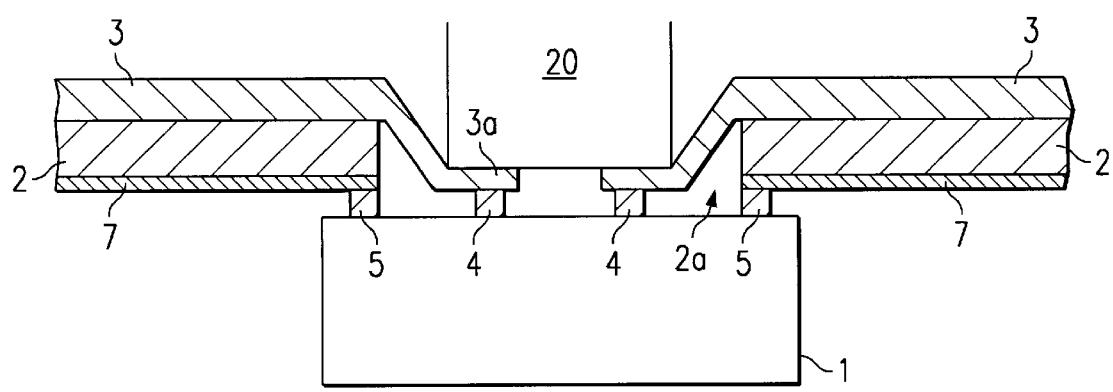
Figure 2D:
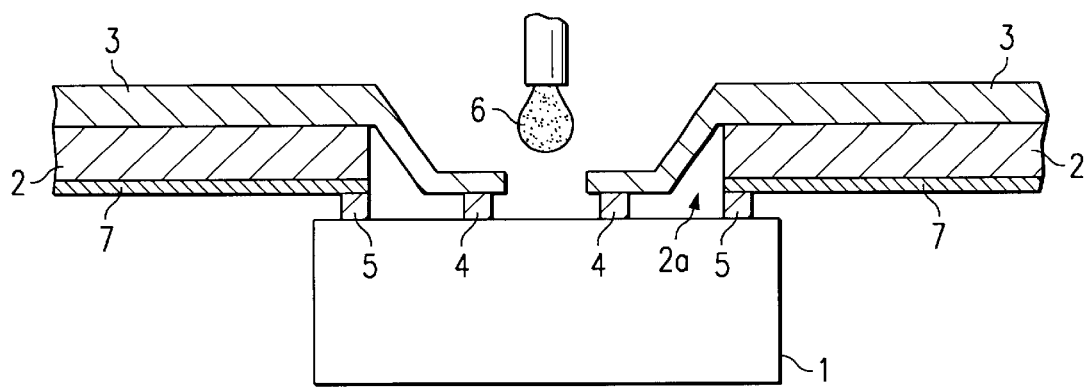

Subsequently, the TAB tape obtained in operation (B) is arranged on semiconductor chip 1 obtained in operation (A) to connect leads 3 to conductor bumps 4 (FIG. 2(C)). In other words, after the inner leads 3a on insulating film 2 and the conductor bumps 4 on semiconductor chip 1 are positioned, inner leads 3a are pressed with bonding tool 20, followed by heating and pressurization. As a result, conductor bumps 4 and inner leads 3 are connected to each other. It is also possible to perform single point bonding to connect the bumps and the leads one at a time. Resin 6 is potted from the above toward opening 2a of the insulating film (FIG. 2(D)). In this case, part of the potted resin flows back to space S between semiconductor chip 1 and elastic film 7 and is maintained there under the surface tension in the space. Then, curing is performed at 150° C. for about 1 h to cure potting resin 6 (FIG. 2(E)).

Figure 2E:
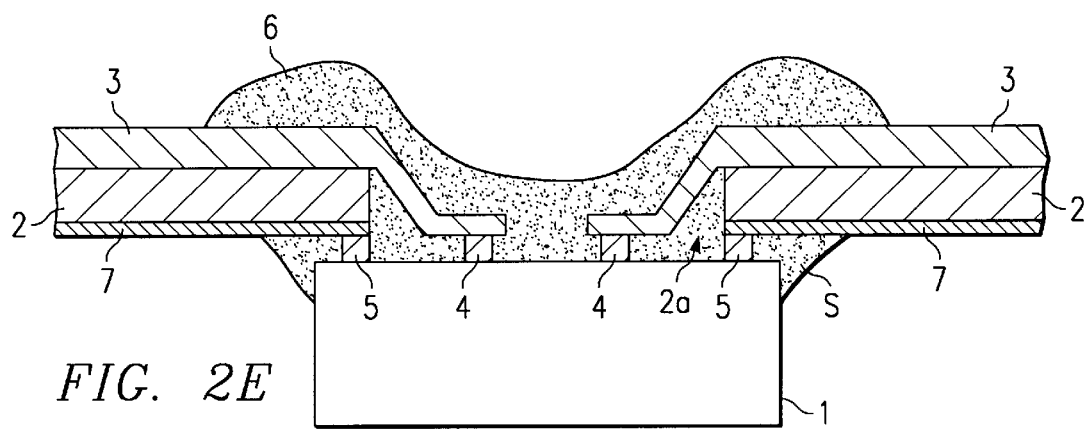
Figure 3:
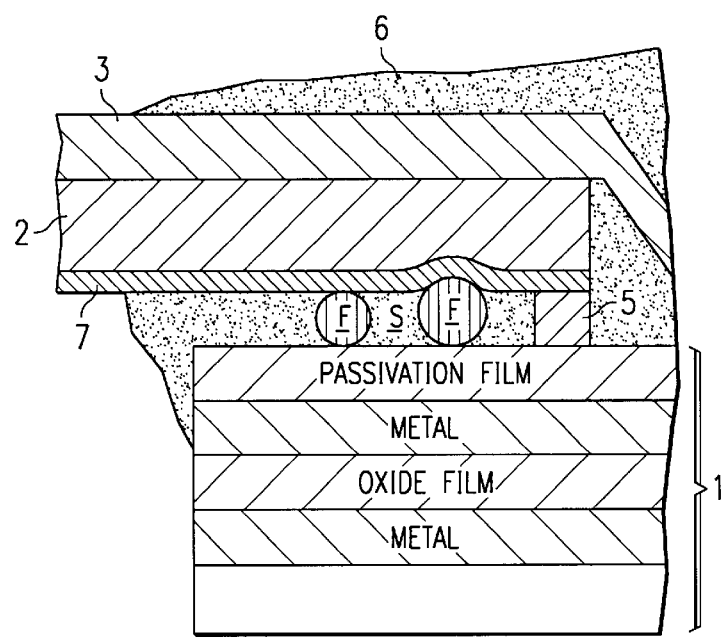
FIG. 3 is a schematic diagram which enlarges the main parts shown in FIG. 1 to explain the function of the semiconductor device of the present invention.
Figure 4:
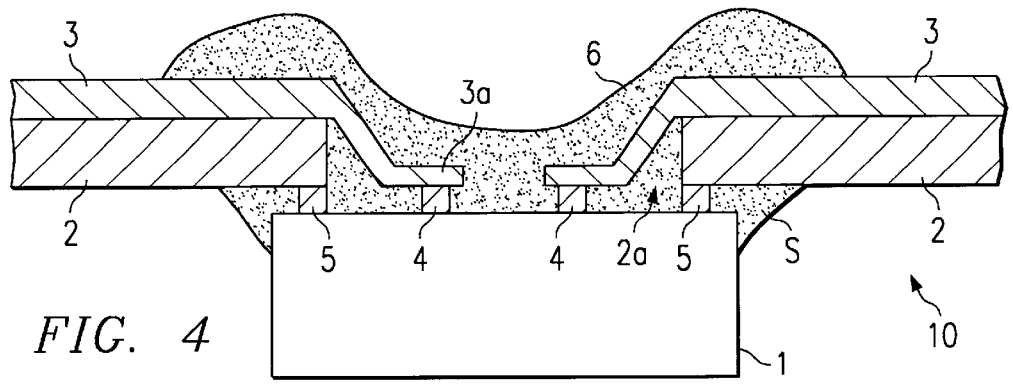
FIG. 4 is a cross-sectional view illustrating a conventional TCP semiconductor device.
Figure 5A:
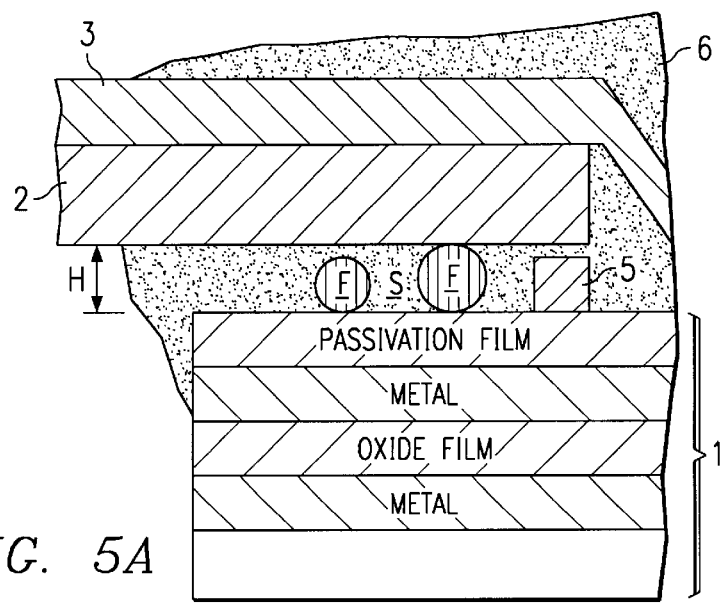
FIG. 5 is a schematic diagram which enlarges the main parts shown in FIG. 4 before and after the curing operation to explain the problems in the semiconductor device shown in FIG. 4.
Figure 5B:
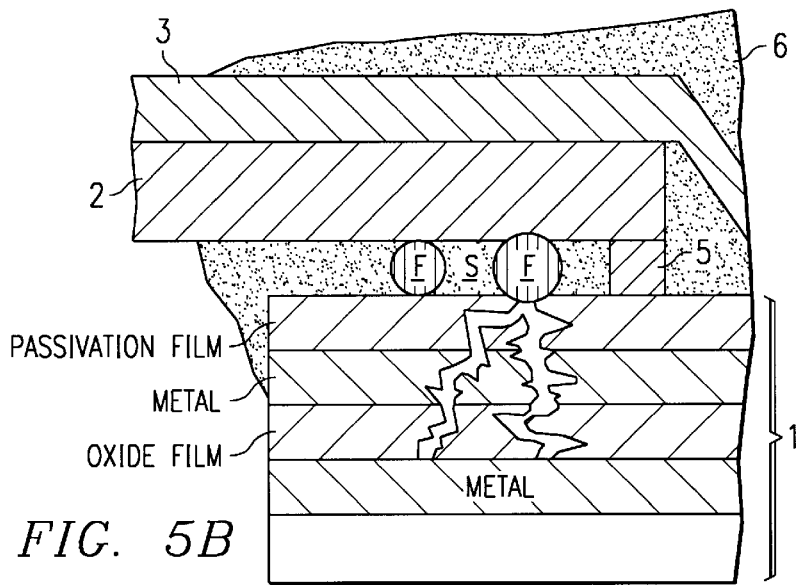

In the aforementioned curing operation (FIG. 2(E)), the solvent is gasified from potting resin 6, and the volume of the resin is reduced by 30%. As a result, as shown in FIG. 3, the distance of the space S between semiconductor chip 1 and elastic film 7 is reduced. The silica filler F of relatively large size and contained in the resin is sandwiched in the space. In this case, the main plane of semiconductor chip 1 usually has an elastic modulus of about 13,400 kgf/mm$^2$, and the elastic modulus of elastic film 7 is 165 kgf/mm$^2$ or smaller. Therefore, as a result of the shrinkage of the resin, elastic film 7 has significant elastic deformation to bury the upper half of silica filler F. Consequently, the stress applied by silica filler F to the main plane of semiconductor chip 1 is reduced, and the damage caused by the filler is reduced significantly.

For the TCP semiconductor device with the configuration shown in FIG. 1, with 0.3 gf set as the critical load under which the silica filler contained in the resin damages the passivation film on the main plane of the semiconductor chip, a simulation was carried out under the conditions listed in Table 1 using the finite element method.

TABLE 1

Conditions of the simulation

| | |
|---|---|
| Thickness of the elastic film ($\mu$m) | 20, 30 |
| Space between the elastic film and the chip's main plane ($\mu$m) | 15 |
| Diameter of the silica filler ($\mu$m) | 15 |
| The distance that the silica filler sinks into the elastic film ($\mu$m) | 5 |

As a result, 165 kgf/mm$^2$ (film thickness: 20 $\mu$m) and 166 kgf/mm$^2$ (film thickness: 30 $\mu$m) were obtained as the critical elastic modulus of elastic film 7. Also, the critical load applied to the semiconductor chip by the filler was measured using the finite element method for polyimide type base film A, epoxy type solder resists B, C, and D with different elastic moduli, polyimide type solder resist E, as well as urethane type solder resist. The results are listed in Table 2. The thickness of the elastic film was 20 $\mu$m and 30 $\mu$m, and the other conditions were the same as those listed in Table 1.

TABLE 2

Simulation of the load applied to the chip's surface by the silica filler.

| Resin | Elastic modulus kgf/mm$^2$ | Resin thickness: 20 $\mu$m | | Resin thickness: 30 $\mu$m | |
|---|---|---|---|---|---|
| | | Load (g) | Crack | Load (g) | Crack |
| Polyimide type base film A | 900.0 | 1.094 | X | 1.094 | X |
| Epoxy type solder resist B | 319.0 | 0.543 | X | 0.492 | X |
| Epoxy type solder resist C | 205.0 | 0.365 | X | 0.332 | X |
| Epoxy type solder resist D | 43.7 | 0.092 | O | 0.077 | O |
| Polyimide type solder resist E | 39.7 | 0.083 | O | 0.071 | O |
| Urethane type solder resist F | 33.9 | 0.072 | O | 0.061 | O |

In Table 2, for the elastic films with an elastic modulus higher than 165 kgf/mm$^2$, the loads all exceed 0.3 gf, that is, the critical load. When these elastic films are used, it is assumed that cracks will appear on the main plane of the semiconductor chip. On the other hand, for the elastic films with an elastic modulus lower than 165 kfg/mm$^2$, their loads are smaller than the critical load. When these elastic films are used, it is assumed that no cracks will appear on the main plane of the semiconductor chip.

Embodiments of the present invention have been explained with reference to the above figures. Obviously, the application range of the present invention is not limited to the aforementioned embodiments. In the aforementioned embodiment, conductor pattern 3 is formed on the top of insulating film 2, that is, on the side opposite to the surface that faces the semiconductor chip. However, it is also possible to form conductor pattern 3 on the surface that faces the semiconductor chip and then form elastic film 7 on conductor pattern 3. In the aforementioned embodiment, elastic film 7 is formed over the entire region on one side of insulating film 2. However, it is also possible to form the elastic film only in the region that faces the main plane of semiconductor chip 1, that is, only in the peripheral region of opening 2a.

As explained above, according to the present invention, the stress applied by the filler onto the main plane of the semiconductor chip can be reduced significantly as the potting resin cures. As a result, damage to the passivation film and oxide film on the semiconductor chip can be prevented, and the semiconductor device yield can be improved.

Applying the present invention, there is no need to change the basic structure of the overlap type TCP semiconductor device in order to realize the aforementioned effect.

What is claimed is:

1. A semiconductor device comprising:

a semiconductor chip which has multiple electrode pads on the main plane;

an insulating film which has an opening smaller than the main plane of the aforementioned semiconductor chip and is arranged in such a way that the opening is positioned on the aforementioned main plane;

an inner lead part which is a conductor pattern comprised of multiple leads formed on the aforementioned insulating film and has each of the leads extended into the opening of the aforementioned insulating film and connected to an electrode on the chip;

an outer lead part which is extended to the outside from the inner lead part; multiple support bumps which are positioned between the main plane of the aforementioned semiconductor chip and the aforementioned insulating film to form a gap between the main plane and the plane opposite the aforementioned main plane of the insulating film;

an elastic film which is formed on the aforementioned insulating film on the side opposite the main plane of the aforementioned semiconductor chip; and a potting resin which is used to cover the opening of the aforementioned insulating film.

2. The semiconductor device described in claim 1 wherein the elastic film has an elastic modulus of 165 kgf/mm$^2$ or less.

3. The semiconductor device described in claim 1 wherein the elastic film has a thickness of 20 $\mu$m or more.

4. The semiconductor device described in claim 2 or 3 wherein the aforementioned elastic film is made of solder resist.

* * * * *